United States Patent
Gasworth

(10) Patent No.: US 7,645,492 B2
(45) Date of Patent: Jan. 12, 2010

(54) PLASMA COATING SYSTEM FOR ACCOMMODATING SUBSTRATES OF DIFFERENT SHAPES

(75) Inventor: Steven M. Gasworth, Farmington Hills, MI (US)

(73) Assignee: Exatec LLC, Wixom, MI (US)

( * ) Notice: Subject to any disclaimer, the term of this patent is extended or adjusted under 35 U.S.C. 154(b) by 319 days.

(21) Appl. No.: 10/903,360

(22) Filed: Jul. 30, 2004

(65) Prior Publication Data

US 2006/0021577 A1 Feb. 2, 2006

(51) Int. Cl.
*B05D 1/08* (2006.01)
*C23C 4/00* (2006.01)
*C23C 16/00* (2006.01)

(52) U.S. Cl. .......... 427/446; 427/209; 427/230; 427/255.5; 427/569; 427/580; 118/719

(58) Field of Classification Search .......... 118/718, 118/719, 630, 632, 723 MP
See application file for complete search history.

(56) References Cited

U.S. PATENT DOCUMENTS

| | | | |
|---|---|---|---|
| 5,378,284 A * | 1/1995 | Geisler et al. | 118/723 MR |
| 5,451,259 A | 9/1995 | Krogh | |
| 5,529,631 A | 6/1996 | Yoshikawa et al. | |
| 5,753,092 A * | 5/1998 | Hollars et al. | 204/298.26 |
| 6,203,898 B1 | 3/2001 | Kohler et al. | |
| 6,397,776 B1 | 6/2002 | Yang et al. | |
| 6,681,716 B2 | 1/2004 | Schaepkens | |
| 6,705,245 B1 | 3/2004 | Jeong et al. | |
| 6,780,290 B2 * | 8/2004 | Ikadai et al. | 204/192.12 |
| 2001/0002284 A1 | 5/2001 | Kohler et al. | |

FOREIGN PATENT DOCUMENTS

| | | |
|---|---|---|
| DE | 197 19 911 A1 | 11/1998 |
| DE | 101 34 037 A1 | 1/2003 |
| DE | 103 51 249 A1 | 6/2005 |
| EP | 0887437 A2 | 12/1998 |
| EP | 0935011 A1 | 8/1999 |
| JP | 62149733 | 7/1987 |
| JP | 63050473 A * | 3/1988 |

OTHER PUBLICATIONS

High-rate deposition of abrasion resistant coatings using a dual-source expanding thermal plasma reactor, M. Schaepkens, S. Selezneva, P. Moeleker, and C.D. Iacovangelo, Jul. 1, 2003, pp. 1266-1271, J. Vac. Sci. Technol. A21(4), Jul./Aug. 2003.

* cited by examiner

*Primary Examiner*—Karla Moore
(74) *Attorney, Agent, or Firm*—Brinks Hofer Gilson & Lione

(57) ABSTRACT

A plasma coating system includes at least one coating station with a first side and a second side defining a pathway with at least one bend. The coating station also includes a first plasma arc that provides a plasma jet directed towards a substrate. The first plasma arc is positioned on either the first side or the second side of the bend.

9 Claims, 4 Drawing Sheets

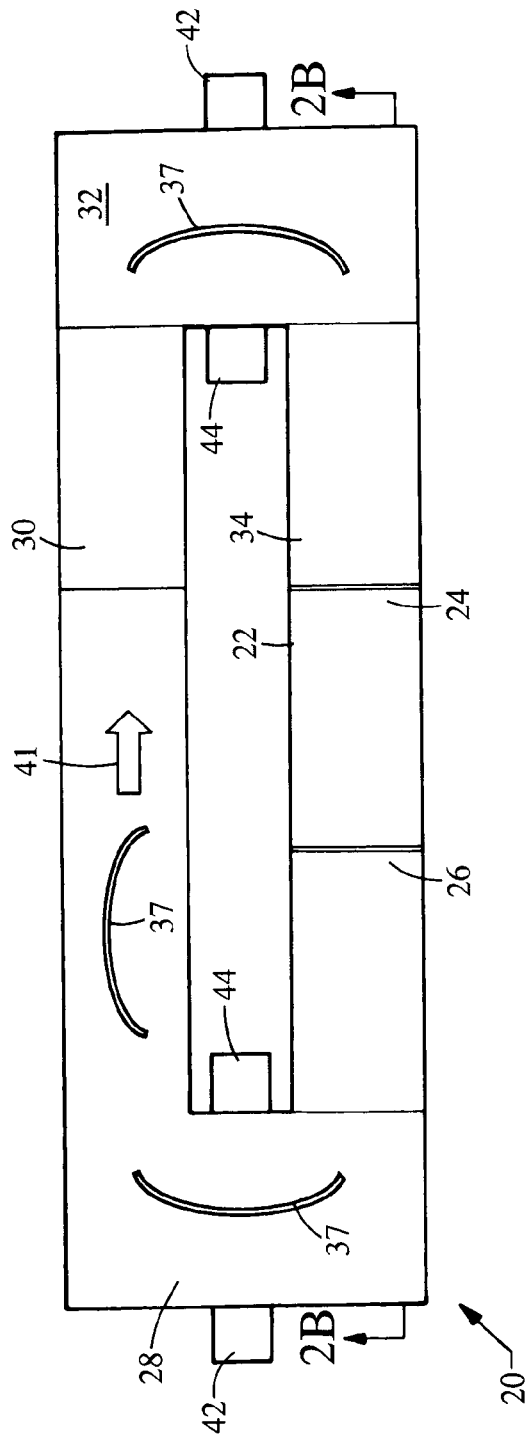
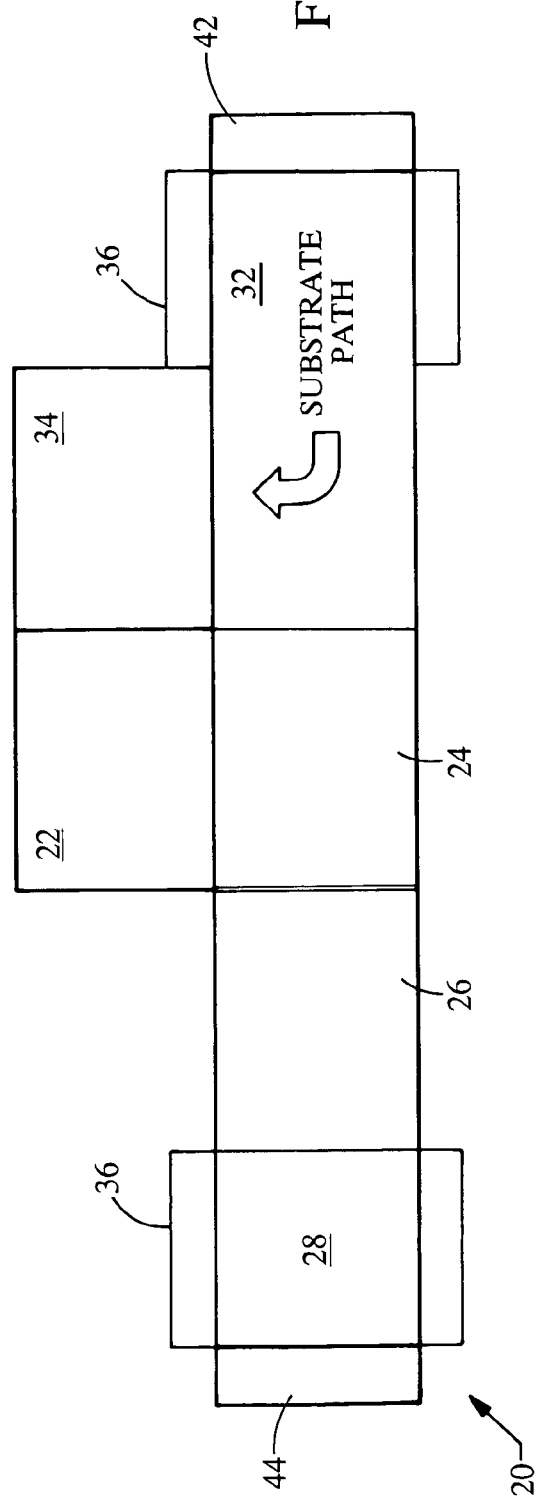

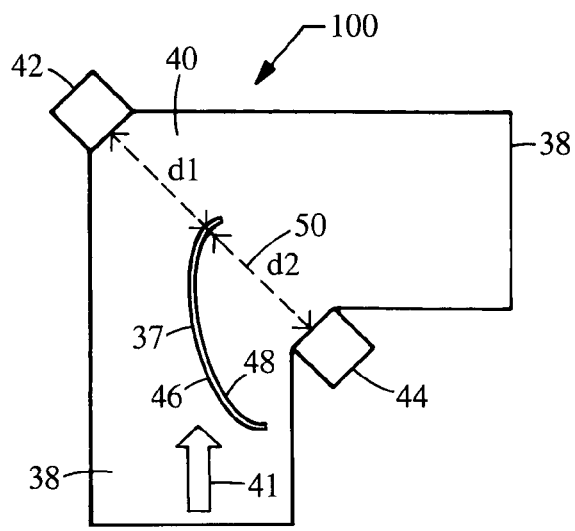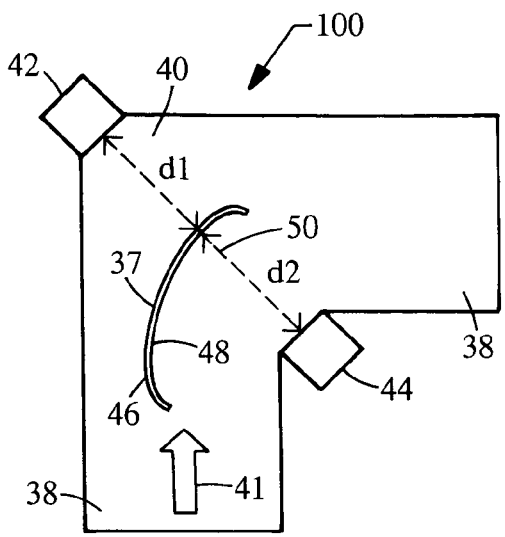
Fig. 4A                Fig. 4B
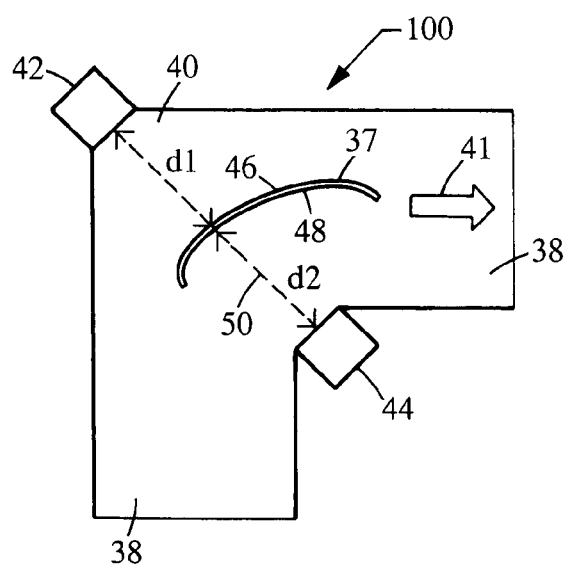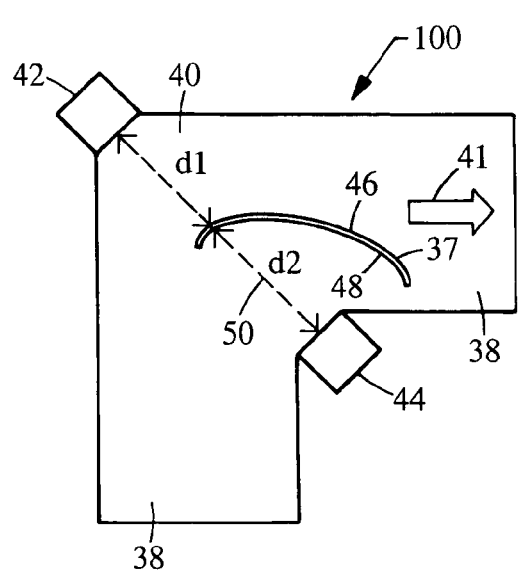
Fig. 4C                Fig. 4D

PLASMA COATING SYSTEM FOR ACCOMMODATING SUBSTRATES OF DIFFERENT SHAPES

BACKGROUND

The present invention relates to a plasma coating system. More specifically, the invention relates to a system that accommodates substrates of different shapes.

In some plasma coating systems, as horizontally oriented substrates advance through a coating station and remain in a horizontal plane, plasma arcs arranged above the substrates direct plasma jets entrained with one or more reagents toward the substrates. Such a configuration cannot accommodate non-planar substrates or provide two-sided coating.

Other plasma coating systems are arranged in a linear manner with the substrates following a fixed linear path through the coating station or coater. The coating station is typically provided with one or more reagent manifolds and plasma arcs that direct plasma jets entrained with reagents at one or both sides of the substrate. As a non-planar substrate passes through the coating station in such systems, the distance between the surface of the substrate and a respective plasma arc varies according to the shape of the substrate. Moreover, the angle of incidence between the plasma jet and the substrate varies as the substrate advances through the coating station.

SUMMARY OF THE INVENTION

The present invention provides a method and apparatus for coating a substrate with a plasma jet entrained with one or more reagents. In a general aspect, a plasma coating system includes at least one coating station with a first side and a second side defining a pathway with at least one bend. The coating station also includes a first plasma arc from which the plasma jet issues. The first plasma arc is positioned on either the first side or second side of the bend. The coating station may include a second plasma arc located on the side opposite that of the first arc. In some implementations, the coating station may include an array of plasma arcs positioned on either side of the coating station or a pair of arrays of arcs located on opposite sides of the coating station.

Further features and advantages of the invention will be apparent from the following description and from the claims.

BRIEF DESCRIPTION OF THE DRAWINGS

FIG. 2A is a top view of a plasma coating system in accordance with an embodiment of the invention.

FIG. 2B is a view of the system of FIG. 2A along the line 2B-2B.

FIGS. 4A through 4D illustrate a substrate moving through a coating station in accordance with another embodiment of the invention.

DETAILED DESCRIPTION

Figure 1:
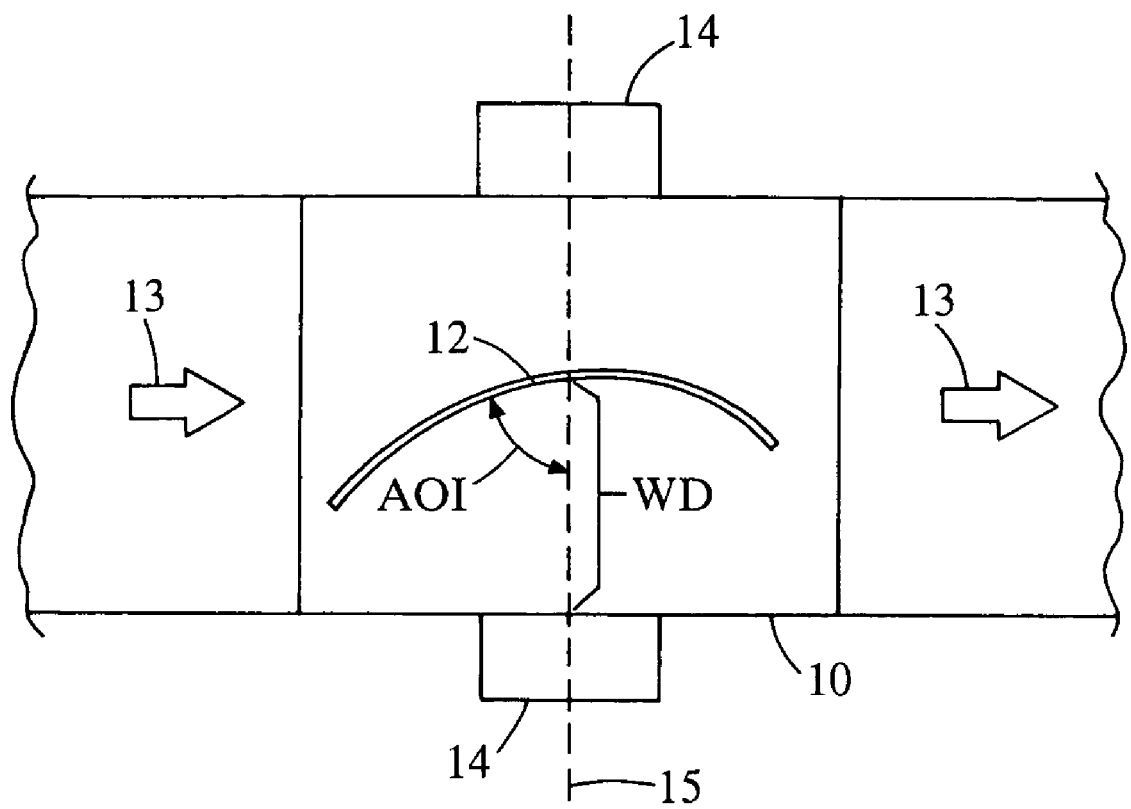
FIG. 1 is a top view of a linear coating station.
Figure 3B:
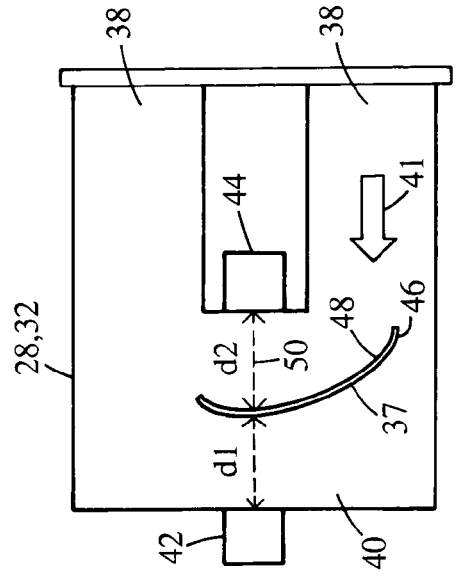
FIGS. 3A through 3D illustrate a substrate moving through a coating station of the system of FIG. 2.
Figure 3D:
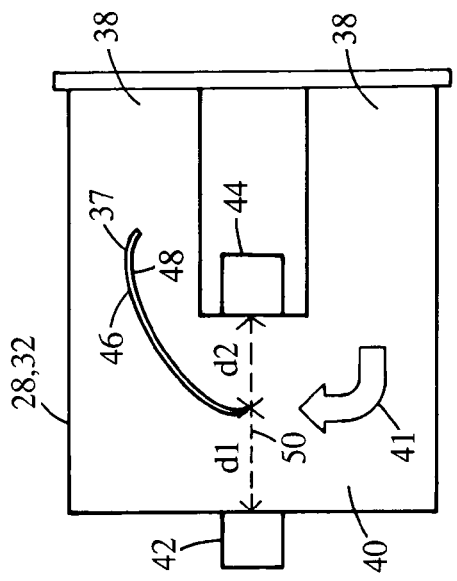
Figure 3A:
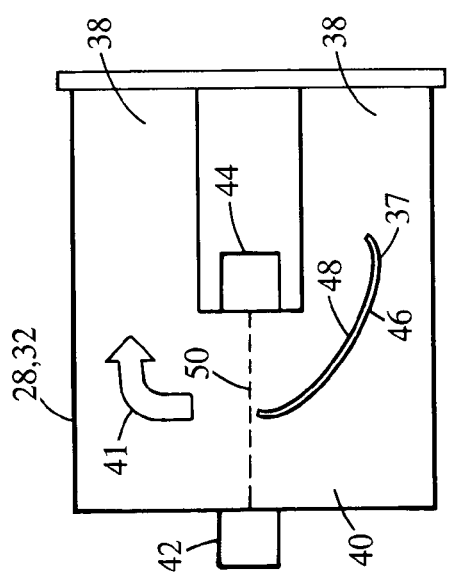
Figure 3C:
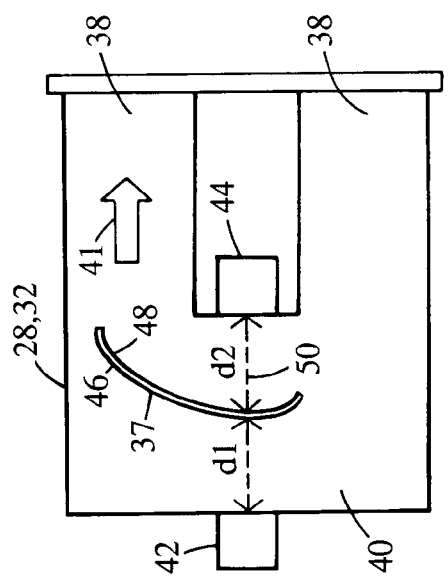

Referring now to FIG. 1, there is shown a linear coating station 10 in which a substrate 12 follows a fixed linear path through the coating station, as indicated by the arrows 13. The substrate may be a component for an automotive vehicle. For example, the substrate may be a rear window or roof panel made of polycarbonate.

The coating station 10 includes a pair of plasma arcs or a pair of arrays of arcs 14 (extending into the page of FIG. 1 as viewed from the top of the coating station 10) on opposite sides of the coating station 10, as well as associated reagent manifolds for providing reagents to the coating process. The coating station 10 may be associated with one or more heaters located upstream of the coating station to heat the substrate before it enters the coating station. An additional coating station may be located downstream of the coating station to provide further plasma coating capabilities, in which case another heater may be located between the two coating stations.

The distance between the arrays of arcs 14 and the surface of the substrate 12 measured along a plane of symmetry 15 (or a line of symmetry for a pair of plasma arcs positioned on opposite sides of the coating station 10) defines a working distance ("WD"), and the angle between the plane of symmetry 15 and the local surface of the substrate is defined as an angle of incidence ("AOI"). Thus, for example, for a coating station with a twenty inch spacing between the plasma arcs and a substrate with a five inch bow (that is, the extent to which the substrate is bowed; see, for example, FIG. 1), the WD for the upper plasma arc may vary from ten to fifteen inches and that for the lower arc may vary from five to ten inches. The AOI may vary from near zero at the edges of the substrate to about 90° at the center of the substrate 12.

In general, the WD and the AOI affect coating thickness, substrate temperature, and overspray at the substrate edges as a result of coating precursors originating from the plasma arcs located on the opposite sides of the substrate, and ultimately other characteristics, such as adhesion, density, composition, and chemical structure, as well as other characteristics, that affect coating performance. Thus, for example, it is desirable to reduce the tendency for relatively thick plasma coating at leading and trailing edges of the substrate, where greater coating thicknesses tend to occur relative to the center of the substrate. Since there is a preferred range for the coating thickness (that is, not too thin, which compromises abrasion-resistance, or not too thick, which compromises water immersion performance), it is desirable to minimize thickness variability across the substrate so as to make the coating process more robust. The relatively thick coating at the leading and trailing edges is a probable contributing factor to less robust water immersion performance at leading and trailing edges of the substrates. Moreover, spurious coating near the substrate edge may be attributable to overspray caused by coating precursors originating from arcs on opposite sides of the substrate, and preferential heating of the edges of these substrates. Thus, the plasma coating process is more robust if the WD and the AOI are limited to suitable ranges.

Referring now FIGS. 2A and 2B, there is shown a coating system 20 that minimizes variations in WD and AOI in accordance with an embodiment of the invention. As its primary components, the system 20 includes a load lock 22, a coarse heater 24, a fine heater 26, a first coating station 28, a fine makeup heater 30, a second coating station 32, and an exit lock 34. Each of the coating stations 28, 32 includes at least one pump port 36 to generate a vacuum in the system 20.

The coating stations 28, 32 have a bend with, for example, a general U-shape to enable coating substrates within relatively narrow WD and AOI ranges. As such, the system 20 is able to accommodate substrates of different shapes and sizes.

For a coating process requiring two coating stations, the make-up heater 30 can be employed. This need may arise, for instance, if the substrate transit time between the two coating stations is long enough to allow significant cooling of the substrate before it reaches the second coating station.

When the system 20 is in use, a substrate 37 is initially loaded in the load lock 22 and transferred into the continuously evacuated zone. Optionally, the coarse heater 24 raises the temperature of the substrate so as not to overburden the fine heater 26. A conveyor system advances the substrate to the fine heater 26 where the temperature of the substrate is further raised for optimal coating in the coating station 28. The conveyor advances the substrate to the coating station 28, where a first coat is applied to the substrate 37. The conveyor then moves the substrate to the make-up heater 30, as indicated by the arrow 41, where the temperature of the substrate is raised to compensate for any heat loss that may occur during the transit from the coating station 28. From the make-up heater 30, the conveyor moves the substrate to the second coating station 32 where a second coat is applied to the substrate. Finally, the conveyor advances the substrate to the exit lock 34 from which the substrate is removed from the system 20.

Referring also to FIGS. 3A through 3D, each coating station 28, 32 is provided with a channel or path 38 with a bend 40, such as a U-turn, and a pair of arrays of plasma arcs (referred to hereinafter as plasma arcs 42, 44) positioned on opposite sides of the bend 40. In some configurations, one or both coating stations 28, 32 may be provided with only a single array of plasma arcs on either side of the bend 40. Further, in certain implementations, the system 20 includes only a single coating station. Moreover, a coating station may include a single plasma arc, rather than an array of arcs, positioned on one side of the bend 40 or a pair of arcs positioned on opposite sides of the bend 40.

The coating stations also include manifolds positioned in some manner about the plasma arcs 42, 44 to provide a suitable flow of reagents during the coating process. The plasma arcs 42, 44 are fed with an inert gas (e.g. argon) which is heated to the point of partial ionization and issues into the vacuum chamber as jets (from the respective arcs) directed towards the substrate to be coated. Coating reagents are introduced between the arcs and the substrate at a controlled rate by injection orifices distributed on the manifolds adjacent to the respective arc jets. A controller may be employed to direct the operation of the plasma arcs and manifolds such that the manifolds can operate independently of one another.

As mentioned above, the system 20 includes a conveyor or transport mechanism that moves the substrate 37 through the channel 38 in the general direction of arrow 41. As illustrated, the substrate 37 has a convex outer surface 46 and an inner concave surface 48. During a coating process, as the substrate 37 maneuvers around the bend 40, the outer plasma arcs 42 and the outer surface 46 of the substrate 37 define a distance d1 and the inner plasma arcs 44 and the inner concave surface 48 define a distance d2.

The opposing plasma arcs 42, 44 are located on a plane of symmetry 50, or a line of symmetry if single arcs are located on one or both sides of the respective coating station. As such, the conveyor system moves the substrate 37 along the path through the bend 40 and simultaneously rotates the substrate so that the substrate intersects the plane of symmetry 50 approximately midway between the plasma arcs 42, 44 and is locally oriented approximately perpendicular to the plane of symmetry 50. That is, the distances d1 and d2 remain substantially the same as the substrate 37 advances through the coating stations 28, 32.

The substrate transport or conveyor mechanism is sufficiently flexible to accommodate substrates with different shapes and sizes such that different substrates can follow different trajectories through the channel 38 (with appropriate tooling change, if needed) to satisfy the preceding conditions on substrate position and orientation relative to the opposing arc arrays. Preferably, substrates with a compound curvature are oriented such that the cross section containing the greater bow and range of surface orientation is parallel to the plane of the bend, with the concave side of the substrate facing the inner plasma arcs.

The coating stations 28, 32 limit the variation of WD and the variation of the AOI during plasma coating within respective ranges for which the coating process yields an acceptable product. The coating stations 28, 32 make it possible to maintain the local surface of a complex shape being coated within narrow WD and AOI ranges, relative to the corresponding ranges that occur when the substrates advance through the coating station 10 illustrated in FIG. 1. This results in an improved process and product consistency, and an expanded range of shapes that can be effectively plasma coated, as compared to conventional coating stations.

Although the coating stations 28, 32 described above have bends 40 shaped as U-turns, the coating stations may have bends with other shapes. For example, an alternative coating station 100 shown in FIG. 4 is provided with a substantially 90° bend 40. In this configuration, the arrays of plasma arcs 42, 44 (or single arcs) are positioned on opposite corners of the bend 40.

A conveyor or transport mechanism moves the substrate 37 through the channel 38 in the general direction of arrow 41. As illustrated, the substrate 37 has a convex outer surface 46 and an inner concave surface 48. During a coating process, as the substrate 37 maneuvers around the bend 40, the outer plasma arcs 42 and the outer surface 46 of the substrate 37 define a distance d1 and the inner plasma arcs 44 and the inner concave surface 48 define a distance d2.

The opposing plasma arcs 42, 44 are located on a plane of symmetry 50, or a line of symmetry if single arcs are located on one or both corners of the bend 40. As such, the conveyor system moves the substrate 37 along the path through the bend 40 and simultaneously rotates the substrate so that the substrate intersects the plane of symmetry 50 approximately midway between the plasma arcs 42, 44 and is locally oriented approximately perpendicular to the plane of symmetry 50. That is, the distances d1 and d2 remain substantially the same as the substrate 37 advances through the coating station 100.

As a person skilled in the art will readily appreciate, the above description is meant as an illustration of various implementations of the principles of this invention. This description is not intended to limit the scope or application of this invention in that the invention is susceptible to modification, variation and change, without departing from spirit of this invention, as defined in the following claims. For example, the system may include coating stations with various bends, but the overall system may be arranged in a linear fashion rather than in the circuit shown in FIG. 2. In some implementations, a component, such as a bowl shaped part, may be rotated about different axes to coat the entire component. For instance, the component may be rotated about different axes in a single coating station, or it may be rotated about one axis in one coating station and about a different axis in another coating station.

What is claimed is:

1. A method of coating a non planar substrate comprising:
   continuously moving the non planar substrate through a bend of a pathway with at least one bend, the pathway having a first side and a second side, the non planar substrate being non planar in the direction of movement through the bend;

while continuously moving the non planar substrate along the bend in the pathway, coating the non planar substrate with at least one coating station including a first plasma arc that provides a plasma jet directed towards a substrate, the first plasma arc being positioned in the bend on one of the first side or the second side; and wherein as the non planar substrate continuously moves through the bend of the coating station, a first working distance is defined between the first plasma arc and the non planar substrate and a second working distance is defined between the substrate and the side of the bend opposite the first plasma arc, maintaining the first working distance substantially the same as the second working distance during continuous movement of the non planar substrate through the bend of the coating station by simultaneously rotating the substrate relative to the pathway.

2. The method of claim 1 further comprising heating the non planar substrate with a fine heater before the non planar substrate enters the coating station.

3. The method of claim 2 further comprising heating the non planar substrate with a coarse heater to a desired temperature before the substrate advances into the fine heater.

4. The method of claim 1 further comprising coating the non planar substrate with a second coating station.

5. The method of claim 4 further comprising heating the non planar substrate with a make-up heater located between the first and the second coating stations to compensate for heat loss during transit from the first coating station.

6. The method of claim 1 wherein an axis of the jet from the plasma arc and a local surface of the substrate define an angle of incidence in the plane of the bend, the angle of incidence being substantially 90° as the non planar substrate maneuvers through the coating station.

7. The method of claim 1 wherein the coating station further includes a second plasma arc located on the side of the bend opposite the first plasma arc.

8. The system of claim 1 wherein the coating station further includes one or more plasma arcs, the first plasma arc and the one or more plasma arcs forming a first array of plasma arcs located on either the first side or the second side of the bend.

9. The system of claim 8 wherein the coating station further includes a second array of plasma arcs including a plurality of plasma arcs located on the side of the bend opposite the first array of plasma arcs.

* * * * *

UNITED STATES PATENT AND TRADEMARK OFFICE
CERTIFICATE OF CORRECTION

PATENT NO.         : 7,645,492 B2                                     Page 1 of 1
APPLICATION NO. : 10/903360
DATED              : January 12, 2010
INVENTOR(S)        : Steven M. Gasworth It is certified that error appears in the above-identified patent and that said Letters Patent is hereby corrected as shown below:

Column 6, Line 15, in claim 8, delete "system" and insert --method--

Column 6, Line 19, in claim 9, delete "system" and insert --method--

Signed and Sealed this

Fourteenth Day of December, 2010

David J. Kappos
*Director of the United States Patent and Trademark Office*